(12) United States Patent
Rokhsaz

(10) Patent No.: US 11,095,337 B2
(45) Date of Patent: *Aug. 17, 2021

(54) COMPUTING DEVICE FOR PROCESSING ENVIRONMENTAL SENSED CONDITIONS

(71) Applicant: RFMicron, Inc., Austin, TX (US)

(72) Inventor: Shahriar Rokhsaz, Austin, TX (US)

(73) Assignee: RFMicron, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/894,821

(22) Filed: Jun. 7, 2020

(65) Prior Publication Data

US 2020/0412405 A1 Dec. 31, 2020

Related U.S. Application Data

(60) Continuation of application No. 15/217,816, filed on Jul. 22, 2016, now Pat. No. 10,715,209, and a
(Continued)

(51) Int. Cl.
*H04B 7/00* (2006.01)
*H04B 1/713* (2011.01)
(Continued)

(52) U.S. Cl.
CPC ............... *H04B 1/713* (2013.01); *H03J 3/20* (2013.01); *H04B 5/0062* (2013.01);
(Continued)

(58) Field of Classification Search
CPC .... H04B 17/318; H04B 5/0037; H04B 1/713; H03J 3/20; H03J 2200/10; H04W 4/008
(Continued)

(56) References Cited

U.S. PATENT DOCUMENTS 5,345,231 A 9/1994 Koo
6,731,199 B1 * 5/2004 Ueda ................. G06K 19/0701
340/10.3
(Continued)

*Primary Examiner* — Kathy W Wang-Hurst
*Assistant Examiner* — Max Mathew
(74) *Attorney, Agent, or Firm* — Garlick & Markison; Timothy W. Markison; Patricia M. Healy

(57) ABSTRACT

A communication system includes a passive wireless sensor and a sensor computing device. The passive wireless sensor is operable to receive a radio frequency (RF) signal including a carrier frequency signal and a modulated sense request signal, generate a power supply voltage, determine received signal strength (RSSI) of the RF signal, and determine whether the RSSI is at a desired level. When the RSSI is at a desired level, the passive wireless sensor generates a response RF signal including the carrier frequency and a coded sense response signal representative of a sensed environmental condition. The sensed environmental condition affects impedance of a front-end of the passive wireless sensor to produce an affected impedance. The passive wireless sensor generates the coded sense response signal based on tuning the affected impedance to resonate with the carrier frequency signal. The computing device operable to: transmit the RF signal, receive the response RF signal, and generate an environmental condition value based on the coded sense response signal and environmental conversion information.

22 Claims, 9 Drawing Sheets

Related U.S. Application Data continuation-in-part of application No. 14/150,392, filed on Jan. 8, 2014, now Pat. No. 9,825,608, which is a division of application No. 13/209,420, filed on Aug. 14, 2011, now Pat. No. 8,749,319, and a continuation-in-part of application No. 12/462,331, filed on Aug. 1, 2009, now Pat. No. 8,081,043, which is a division of application No. 11/601,085, filed on Nov. 18, 2006, now Pat. No. 7,586,385, and a continuation-in-part of application No. 14/256,877, filed on Apr. 18, 2014, now Pat. No. 9,785,807, and a continuation-in-part of application No. 13/209,420, filed on Aug. 14, 2011, now Pat. No. 8,749,319, and a continuation-in-part of application No. 12/462,331, filed on Aug. 1, 2009, now Pat. No. 8,081,043, which is a division of application No. 11/601,085, filed on Nov. 18, 2006, now Pat. No. 7,586,385, and a continuation-in-part of application No. 13/209,425, filed on Aug. 14, 2011, now Pat. No. 9,048,819, and a continuation-in-part of application No. 12/462,331, filed on Aug. 1, 2009, now Pat. No. 8,081,043, which is a division of application No. 11/601,085, filed on Nov. 18, 2006, now Pat. No. 7,586,385, and a continuation-in-part of application No. 13/467,925, filed on May 9, 2012, now Pat. No. 10,224,902, and a continuation-in-part of application No. 13/209,425, filed on Aug. 14, 2011, now Pat. No. 9,048,819, and a continuation-in-part of application No. 12/462,331, filed on Aug. 1, 2009, now Pat. No. 8,081,043, which is a division of application No. 11/601,085, filed on Nov. 18, 2006, now Pat. No. 7,586,385.

(60) Provisional application No. 62/196,036, filed on Jul. 23, 2015, provisional application No. 61/428,170, filed on Dec. 29, 2010, provisional application No. 61/485,732, filed on May 13, 2011, provisional application No. 61/814,241, filed on Apr. 20, 2013, provisional application No. 61/833,150, filed on Jun. 10, 2013, provisional application No. 61/833,167, filed on Jun. 10, 2013, provisional application No. 61/833,265, filed on Jun. 10, 2013, provisional application No. 61/875,599, filed on Sep. 9, 2013, provisional application No. 61/896,102, filed on Oct. 27, 2013, provisional application No. 61/929,017, filed on Jan. 18, 2014, provisional application No. 61/934,935, filed on Feb. 3, 2014.

(51) Int. Cl.
*H04B 17/318* (2015.01)
*H03J 3/20* (2006.01)
*H04B 5/00* (2006.01)
*H04W 4/80* (2018.01)

(52) U.S. Cl.
CPC ............ *H04B 17/318* (2015.01); *H04W 4/80* (2018.02); *H03J 2200/10* (2013.01)

(58) Field of Classification Search
USPC .............................................. 455/41.1, 41.2
See application file for complete search history.

(56) References Cited

U.S. PATENT DOCUMENTS

| | | | |
|---|---|---|---|
| 6,762,686 B1* | 7/2004 | Tabe ..................... | G08B 25/08 340/541 |
| 6,806,808 B1* | 10/2004 | Watters .................. | G01D 5/48 340/10.41 |
| 6,894,609 B2* | 5/2005 | Menard ................ | G08B 25/008 340/3.1 |
| 7,623,896 B2* | 11/2009 | Tanaka ................. | H03G 3/3042 455/572 |
| 9,613,237 B2* | 4/2017 | Nikunen ............ | G06K 19/0716 |
| 10,248,899 B2* | 4/2019 | Kesler ..................... | H02J 50/60 |
| 2003/0080862 A1* | 5/2003 | Kranz ................. | B60C 23/0433 340/442 |
| 2007/0298834 A1* | 12/2007 | Rofougaran ...... | H04M 1/72412 455/552.1 |
| 2012/0161536 A1* | 6/2012 | Kamata ................... | H02J 7/025 307/104 |
| 2012/0224495 A1* | 9/2012 | Lafleur ................... | H04L 43/10 370/248 |
| 2012/0304767 A1* | 12/2012 | Howard ............... | A61B 5/0004 73/504.03 |
| 2013/0106607 A1* | 5/2013 | Clement ................. | B01L 3/545 340/572.1 |
| 2013/0204202 A1* | 8/2013 | Trombly ............... | A61M 5/172 604/207 |
| 2015/0112264 A1* | 4/2015 | Kamen ................. | G16H 40/67 604/151 |

* cited by examiner wireless communication system 10

RF signal 120

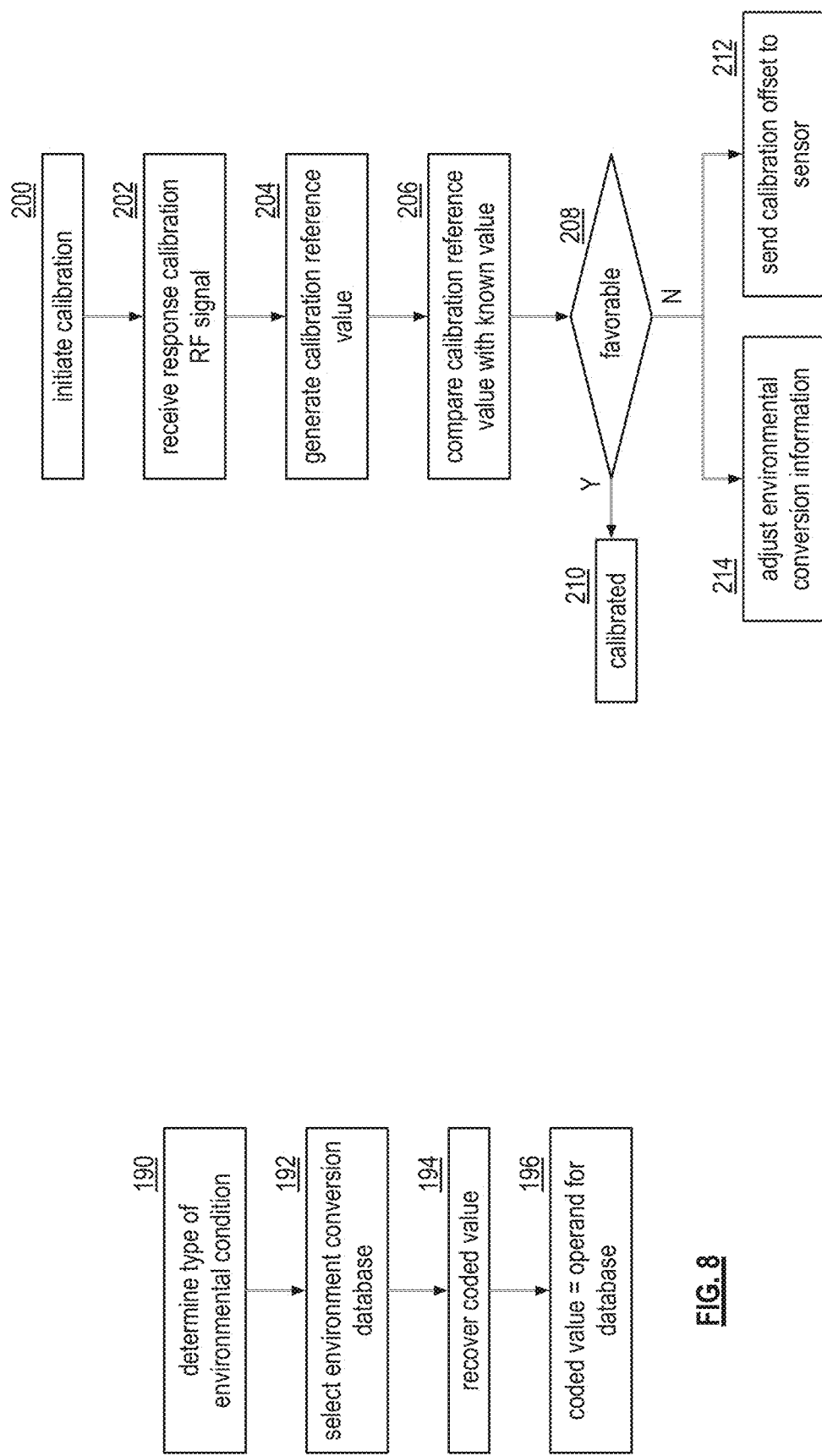

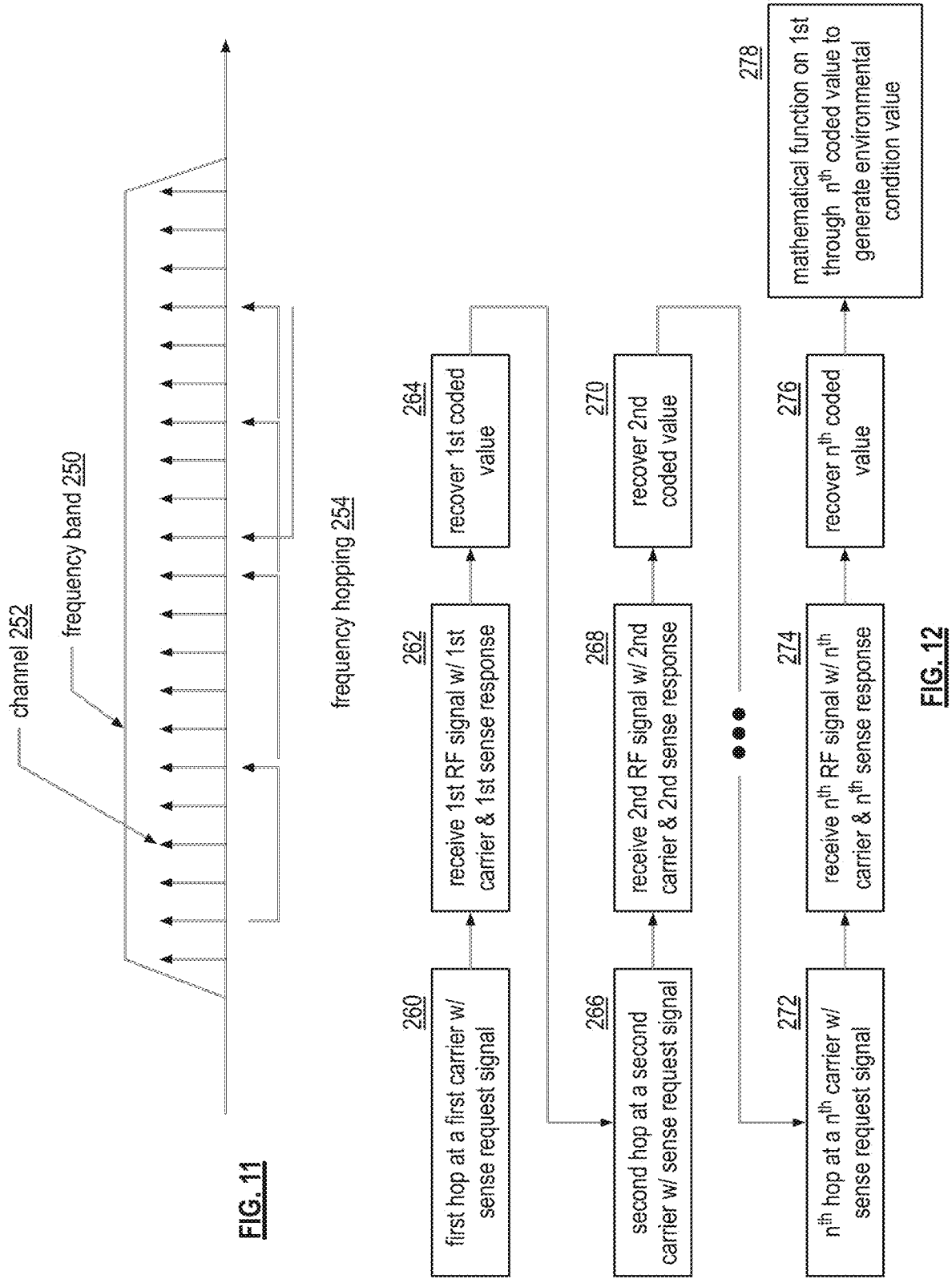

COMPUTING DEVICE FOR PROCESSING ENVIRONMENTAL SENSED CONDITIONS

CROSS REFERENCE TO RELATED APPLICATIONS

The present U.S. Utility Patent Application claims priority pursuant to 35 U. S.C. § 120 as a continuation of U.S. Utility application Ser. No. 15/217,816, entitled "COMPUTING DEVICE FOR PROCESSING ENVIRONMENTAL SENSED", filed Jul. 22, 2016, which claims priority pursuant to 35 U.S.C. § 119(e) to U.S. Provisional Application No. 62/196,036, entitled "PASSIVE RFID SOFTWARE DEFINED RADIO SYSTEM", filed Jul. 23, 2015, which are hereby incorporated herein by reference in their entirety and made part of the present U.S. Utility Patent Application for all purposes.

The present U.S. Utility Patent Application also claims priority pursuant to 35 U.S.C. § 120 as a continuation-in-part of U.S. Utility application Ser. No. 14/150,392, entitled "METHOD AND APPARATUS FOR DETECTING RF FIELD STRENGTH", filed Jan. 8, 2014, which is a divisional of U.S. Utility application Ser. No. 13/209,420, entitled "METHOD AND APPARATUS FOR DETECTING RF FIELD STRENGTH", filed Aug. 14, 2011, now U.S. Pat. No. 8,749,319, issued on Jun. 10, 2014, which claims priority pursuant to 35 U. S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,420 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Dec. 18, 2006, now U.S. Pat. No. 7,586,385, issued on Sep. 8, 2009, all of which are hereby incorporated herein by reference in their entirety and made part of the present U.S. Utility Patent Application for all purposes.

U.S. Utility Patent Application No. also claims priority pursuant to 35 U.S.C. § 120 as a continuation-in-part of U.S. Utility application Ser. No. 14/256,877, entitled "METHOD AND APPARATUS FOR SENSING ENVIRONMENT USING A WIRELESS PASSIVE SENSOR", filed Apr. 18, 2014, no U.S. Pat. No. 9,785,807, issued on Oct. 10, 2017, which claims priority pursuant to 35 U.S.C. § 119(e) to U.S. Provisional Application No. 61/814,241, entitled "RFID ENVIRONMENTAL SENSOR", filed Apr. 20, 2013; U.S. Provisional Application No. 61/833,150, entitled "RESONANT ANTENNA", filed Jun. 10, 2013; U.S. Provisional Application No. 61/833,167, entitled "RFID TAG", filed Jun. 10, 2013; U.S. Provisional Application No. 61/833,265, entitled "RFID TAG", filed Jun. 10, 2013; U.S. Provisional Application No. 61/871,167, entitled "RESONANT ANTENNA", filed Aug. 28, 2013; U.S. Provisional Application No. 61/875,599, entitled "CMF ACCURATE SENSOR", filed Sep. 9, 2013; U.S. Provisional Application No. 61/896,102, entitled "RESONANT ANTENNA", filed Oct. 27, 2013; U.S. Provisional Application No. 61/929,017, entitled "RFID ENVIRONMENTAL SENSOR", filed Jan. 18, 2014; U.S. Provisional Application No. 61/934,935, entitled "RFID ENVIRONMENTAL SENSOR", filed Feb. 3, 2014; all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/209,420, entitled "METHOD AND APPARATUS FOR DETECTING RF FIELD STRENGTH", filed Aug. 14, 2011, now U.S. Pat. No. 8,749,319, issued on Jun. 10, 2014, which claims priority pursuant to 35 U.S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,420 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/209,425, entitled "METHOD AND APPARATUS FOR DETECTING RF FIELD STRENGTH", filed Aug. 14, 2011, now U.S. Pat. No. 9,048,819, issued on Jun. 2, 2015, which claims priority pursuant to 35 U. S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,425 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/467,925, entitled "ROLL-TO-ROLL PRODUCTION OF RFID TAGS", filed May 9, 2012, which is a continuation-in-part of U.S. Utility application Ser. No. 13/209,425, entitled "METHOD AND APPARATUS FOR DETECTING RF FIELD STRENGTH", filed Aug. 14, 2011, now U.S. Pat. No. 9,048,819, issued on Jun. 2, 2015, which claims priority pursuant to 35 U.S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,425 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

Technical Field of the Invention

This application relates generally to wireless data communication systems and more particularly to processing data representative of environmental sensed conditions.

Description of Related Art

Wireless communication systems are known to include wireless transceivers that communication directly and/or over a wireless communication infrastructure. In direct wireless communications, a first wireless transceiver includes baseband processing circuitry and a transmitter to convert data into a wireless signal (e.g., radio frequency (RF), infrared (IR), ultrasound, near field communication (NFC), etc.). Via the transmitter, the first wireless transceiver transmits the wireless signal. When a second wireless transceiver is in range (e.g., is close enough to the first wireless transceiver to receive the wireless signal at a sufficient power level), it receives the wireless signal via a receiver and converts the signal into meaningful information (e.g., voice, data, video, audio, text, etc.) via baseband processing circuitry. The second wireless transceiver may wirelessly communicate back to the first wireless transceiver in a similar manner.

Examples of direct wireless communication (or point-to-point communication) include walkie-talkies, Bluetooth, ZigBee, Radio Frequency Identification (RFID), etc. As a more specific example, when the direct wireless communication is in accordance with RFID, the first wireless transceiver may be an RFID reader and the second wireless transceiver may be an RFID tag.

For wireless communication via a wireless communication infrastructure, a first wireless communication device transmits a wireless signal to a base station or access point, which conveys the signal to a wide area network (WAN) and/or to a local area network (LAN). The signal traverses the WAN and/or LAN to a second base station or access point that is connected to a second wireless communication device. The second base station or access point sends the signal to the second wireless communication device. Examples of wireless communication via an infrastructure include cellular telephone, IEEE 802.11, public safety systems, etc.

In many situations, direct wireless communication is used to gather information that is then communicated to a computer. For example, an RFID reader gathers information from RFID tags via direct wireless communication. At some later point in time (or substantially concurrently), the RFID reader downloads the gathered information to a computer via a direct wireless communication or via a wireless communication infrastructure.

In many RFID systems, the RFID tag is a passive component. As such, the RFID tag has to generate one or more supply voltages from the RF signals transmitted by the RFID reader. Accordingly, a passive RFID tag includes a power supply circuit that converts the RF signal (e.g., a continuous wave AC signal) into a DC power supply voltage. The power supply circuit includes one or more diodes and one or more capacitors. The diode(s) function to rectify the AC signal and the capacitor(s) filter the rectified signal to produce the DC power supply voltage, which powers the circuitry of the RFID tag.

Once powered, the RFID tag receives a command from the RFID reader to perform a specific function. For example, if the RFID tag is attached to a particular item, the RFID tag stores a serial number, or some other identifier, for the item. In response to the command, the RFID tag retrieves the stored serial number and, using back-scattering, the RFID tag transmits the retrieved serial number to the RFID reader.

BRIEF DESCRIPTION OF THE SEVERAL VIEWS OF THE DRAWING(S)

FIG. 8 is a logic diagram of an example of generating an environmental condition value in accordance with the present invention;

FIG. 9 is a logic diagram of an example of calibrating communication between a sensor computing device communicating and a passive wireless sensor in accordance with the present invention;

FIG. 11 is a diagram of an example of frequency hopping in accordance with the present invention; and FIG. 12 is a logic diagram of an example of frequency hopping communication between a sensor computing device and a passive wireless sensor in accordance with the present invention.

DETAILED DESCRIPTION OF THE INVENTION

Figure 1:
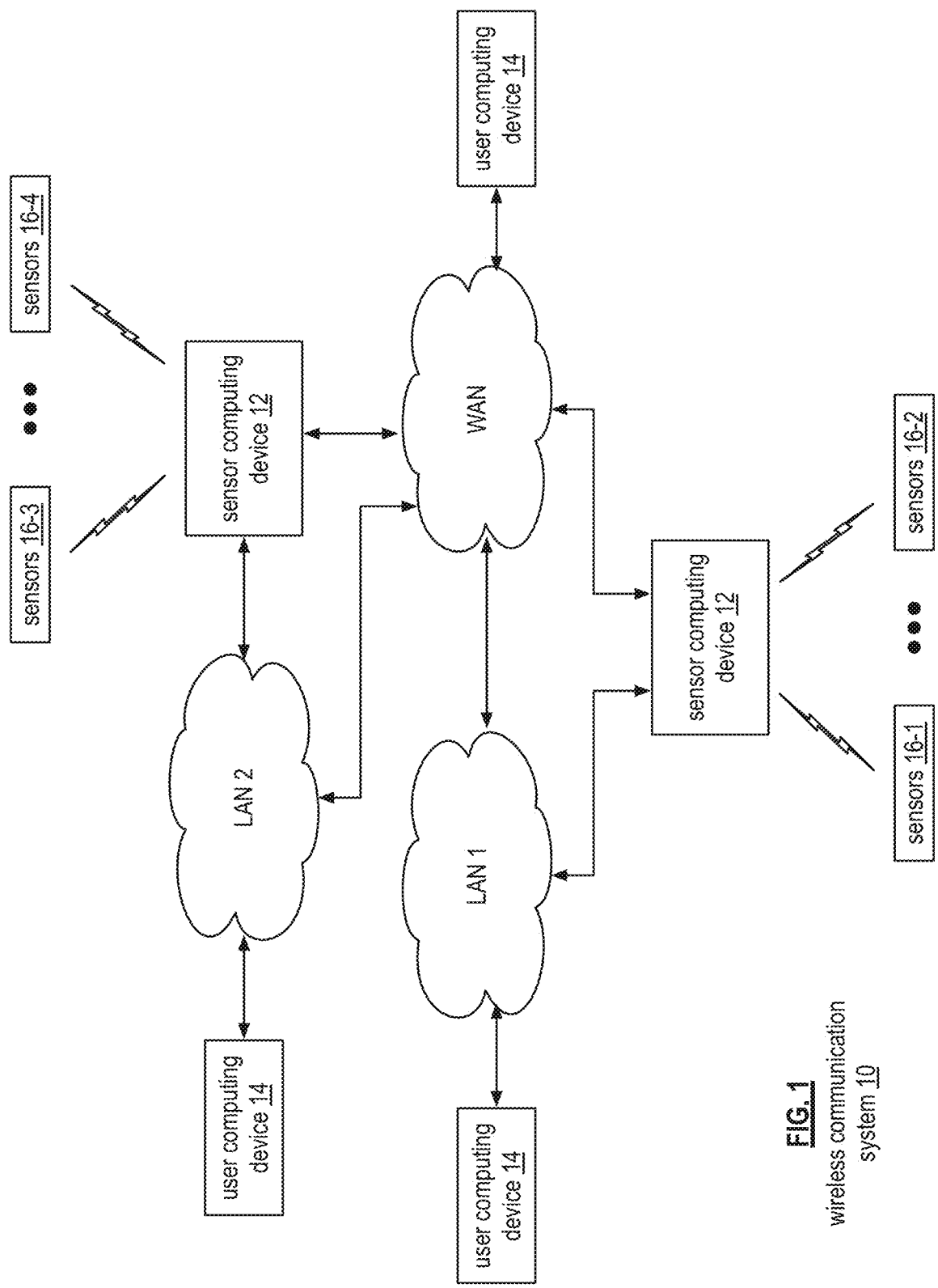
FIG. 1 is a schematic block diagram of an embodiment of a communication system in accordance with the present invention.

FIG. 1 is a schematic block diagram of an embodiment of a communication system 10 that includes a plurality of sensor computing device 12, a plurality of user computing devices 14, a plurality of passive wireless sensors 16-1 through 16-4, one or more wide area networks (WAN), and one or more local area networks (LAN). The passive wireless sensors 16-1 through 16-4, when activated, sense one or more of a variety of conditions. For example, one passive wireless sensor senses for the presence, absence, and/or amount of moisture in a given location (e.g., in a room, in a manufactured item or component thereof (e.g., a vehicle), in a bed, in a diaper, etc.). As another example, a passive wireless sensor senses pressure on and/or in a particular item (e.g., on a seat, on a bed, in a tire, etc.)

As yet another example, a passive wireless sensor senses temperature within a space and/or of an item (e.g., surface temperature of the item, in a confined space such as a room or a box, etc.). As a further example, a passive wireless sensor senses humidity within a space (e.g., a room, a closet, a box, a container, etc.). As a still further example, a passive wireless sensor senses the presence and/or percentages of a gas within a space (e.g., carbon monoxide in a car, carbon monoxide in a room, gas within a food container, etc.). As an even further example, a passive wireless sensor senses the presence and/or percentages of a light within a space. As yet a further example, a passive wireless sensor senses the presence, percentages, and/or properties of one or more liquids in a solution. In one more example, a passive wireless sensor senses location proximity of one item to another and/or the proximity of the passive wireless sensor to an item (e.g., proximity to a metal object, etc.).

In general, the sensor computing devices 12 function to collect the sensed data from the passive wireless sensors and process the sensed data. For example, a passive wireless sensor generates a coded value representative of a sensed condition (e.g., amount of moisture). A sensor computing device 12 receives the coded value and processes it to determine an accurate measure of the sensed condition (e.g., a value corresponding to the amount of moisture such as 0% saturated, 50% saturated, 100% saturated, etc.).

The user computing devices 14 communication with one or more of the sensor computing devices 12 to gather the accurate measures of sensed conditions for further processing. For example, assume that the wireless communication system is used by a manufacturing company that has multiple locations for assembly of its products. In particular, LAN 1 is at a first location where a first set of components of products are processed and the LAN 2 is at a second location where second components of the products and final assembly of the products occur. Further assume that the corporate headquarters of the company is at a third location, where it communicates with the first and second locations via the WAN and LANs.

In this example, the sensor computing device 12 coupled to LAN 1 collects and processes data regarding the first set of components as sensed by passive wireless sensors 16-1 and 16-2. The sensor computing device 12 is able to communicate this data to the user computing device 14 coupled to the LAN 1 and/or to the computing device 14 at corporate headquarters via the WAN. Similarly, the sensor computing device 12 coupled to LAN 2 collects and processes data regarding the second set of components and final assembly as sensed by passive wireless sensors 16-3 and 16-4. This sensor computing device 12 is able to communicate this data to the user computing device 14 coupled to the LAN 2 and/or to the computing device 14 at corporate headquarters via the WAN. In such a system, real time monitor is available locally (e.g., via the LAN) and is further available non-locally (e.g., via the WAN). Note that any of the user computing devices 14 may receive data from the any of the sensor computing devices 12 via a combination of LANs and the WAN.

Figure 2:
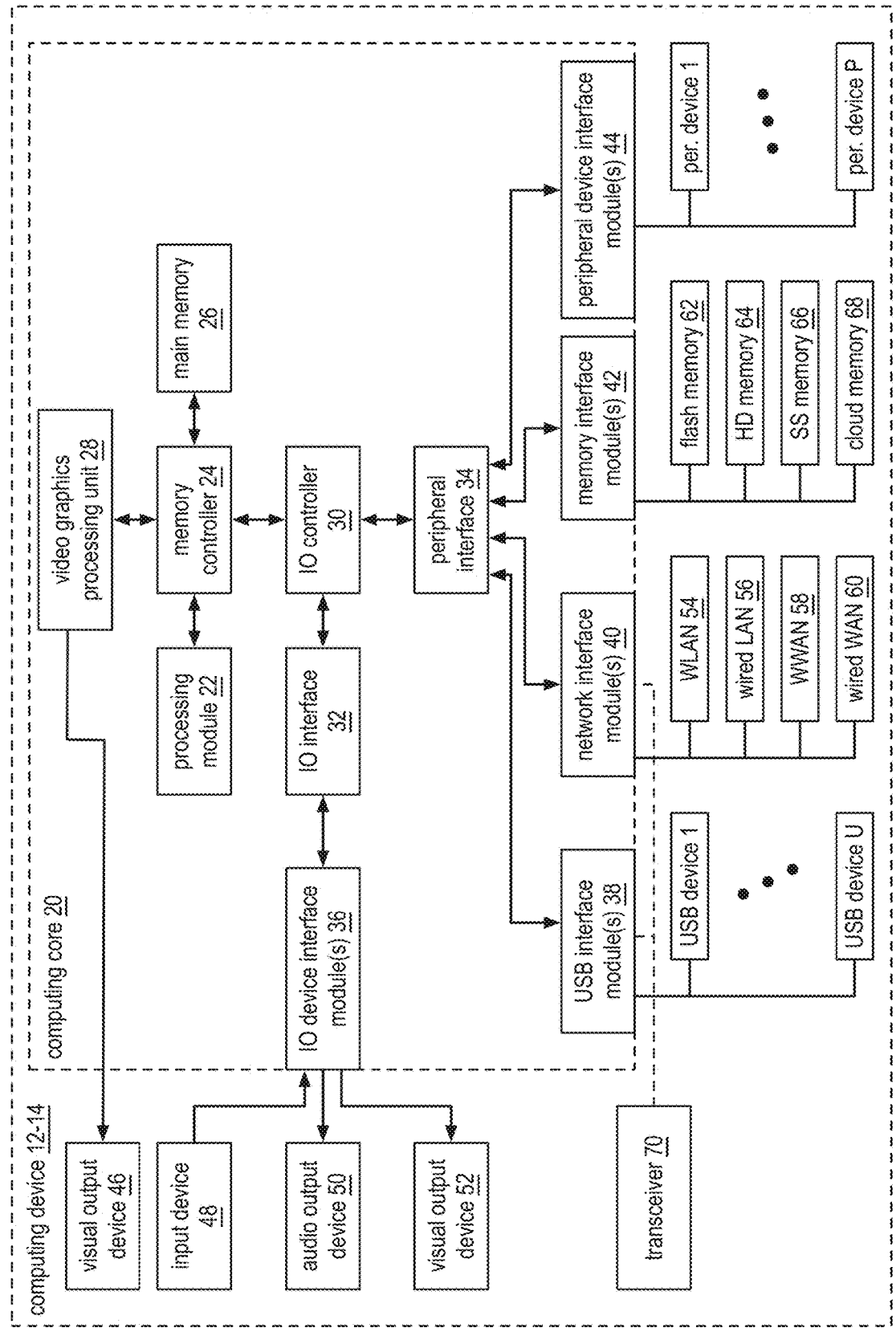
FIG. 2 is a schematic block diagram of an embodiment of a computing device in accordance with the present invention.

FIG. 2 is a schematic block diagram of an embodiment of a computing device 12 and/or 14 that includes a computing core 20, one or more input devices 48 (e.g., keypad, keyboard, touchscreen, voice to text, etc.), one or more audio output devices 50 (e.g., speaker(s), headphone jack, etc.), one or more visual output devices 46 (e.g., video graphics display, touchscreen, etc.), one or more universal serial bus (USB) devices, one or more networking devices (e.g., a wireless local area network (WLAN) device 54, a wired LAN device 56, a wireless wide area network (WWAN) device 58 (e.g., a cellular telephone transceiver, a wireless data network transceiver, etc.), and/or a wired WAN device 60), one or more memory devices (e.g., a flash memory device 62, one or more hard drives 64, one or more solid state (SS) memory devices 66, and/or cloud memory 96), one or more peripheral devices, and/or a transceiver 70.

The computing core 20 includes a video graphics processing unit 28, one or more processing modules 22, a memory controller 24, main memory 26 (e.g., RAM), one or more input/output (I/O) device interface module 36, an input/output (I/O) interface 32, an input/output (I/O) controller 30, a peripheral interface 34, one or more USB interface modules 38, one or more network interface modules 40, one or more memory interface modules 42, and/or one or more peripheral device interface modules 44. Each of the interface modules 36-44 includes a combination of hardware (e.g., connectors, wiring, etc.) and operational instructions stored on memory (e.g., driver software) that is executed by the processing module 22 and/or a processing circuit within the respective interface module. Each of the interface modules couples to one or more components of the computing device 12-14. For example, one of the 10 device interface modules 36 couples to an audio output device 50. As another example, one of the memory interface modules 42 couples to flash memory 62 and another one of the memory interface modules 42 couples to cloud memory 68 (e.g., an on-line storage system and/or on-line backup system).

The transceiver 70 is coupled to the computing core 20 via a USB interface module 38, a network interface module 40, a peripheral device interface module 44, or a dedicated interface module (not shown). Regardless of how the transceiver 70 is coupled to the computing core, it functions to communication with the passive wireless sensors.

Figure 3:
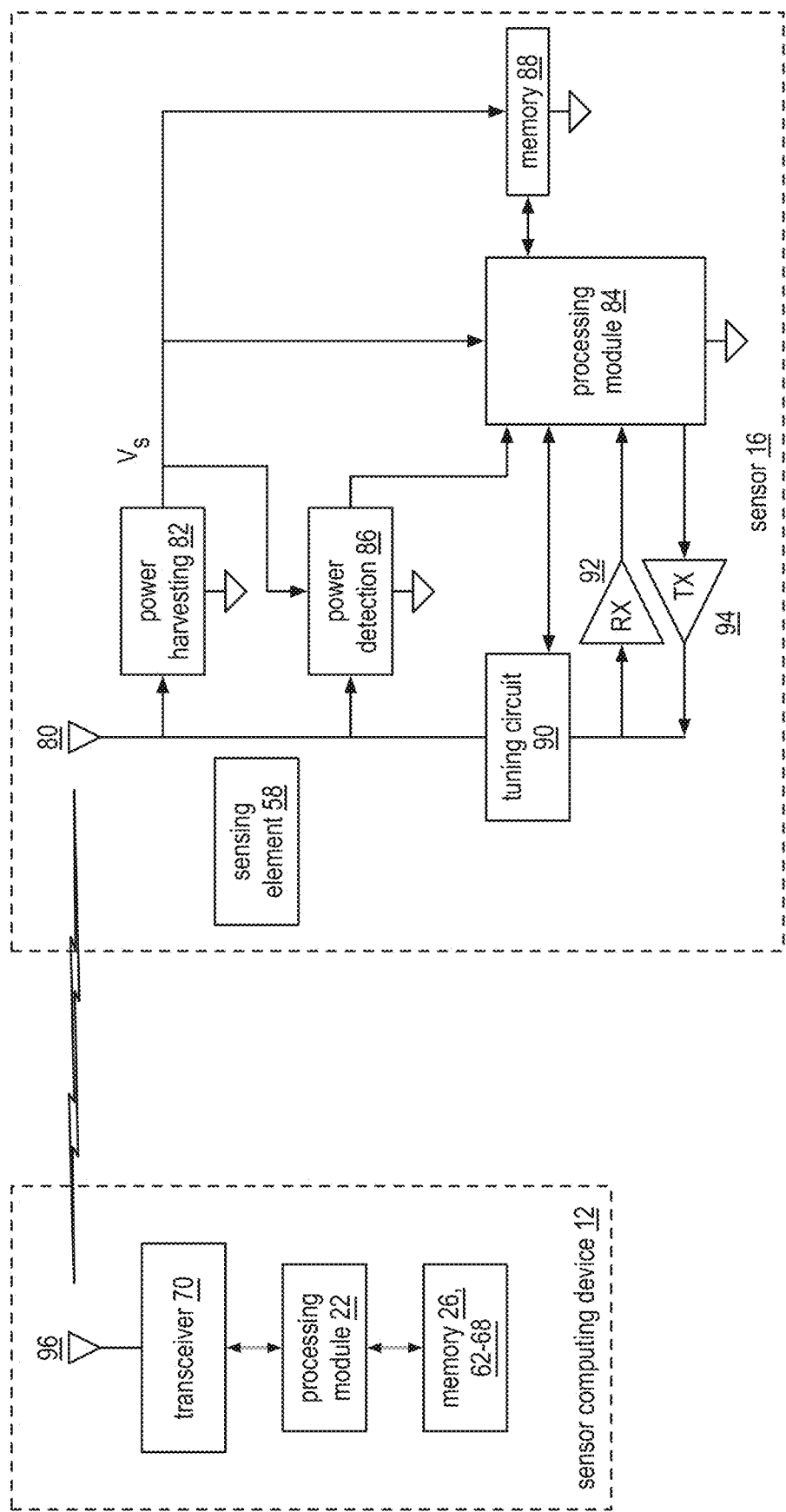
FIG. 3 is a schematic block diagram of an example of a sensor computing device communicating with a passive wireless sensor in accordance with the present invention.

FIG. 3 is a schematic block diagram of an example of a sensor computing device 12 communicating with a passive wireless sensor 16 (e.g., any one of 16-1 through 16-4).

The sensor computing device 12 is illustrated in a simplified manner; as such, it shown to include the transceiver 70, an antenna 96, the processing module 22, and the memory (e.g., one or more 26 and 62-68). The passive wireless sensor 16 includes an antenna 80, a one or more sensing elements 58, a power harvesting circuit 82, a power detection circuit 86, a processing module 84, memory 88, a tuning circuit 90, a receiver section 92, and a transmitter section 94.

In an example, the sensing element 58 of the passive wireless sensor 16 senses an environmental condition of an object. The environment condition includes, but is not limited to, one or more of moisture, temperature, pressure, humidity, altitude, sonic wave (e.g., sound), human contact, surface conditions, tracking, location, etc. The object includes one or more of, but is not limited to, a box, a personal item (e.g., clothes, diapers, etc.), a pet, an automobile component, an article of manufacture, an item in transit, etc. The sensing element 58 senses the environmental condition (e.g., moisture) and, as a result of the sensed condition, the sensing element 58 affects an operational parameter (e.g., input impedance, quality factor, frequency, etc.) of an RF front end of the passive wireless sensor. Note that the RF front end includes one or more of the antenna 80, the tuning circuit 90, the transmitter section 94, the receiver section 92.

As a specific example, the sensing element 58, as a result of the sensed environmental condition, affects the input impedance of the antenna structure 80 and/or of the tuning circuit 90 (e.g., a tank circuit that includes one or more capacitors and one or inductors having a resonant frequency corresponding to the carrier frequency of the RF signal). In response to the impedance change, the processing module 84 adjusts the resonant frequency of the tuning circuit 90 to compensate for the change in input impedance caused by the sensed environmental condition. The amount of adjustment is reflective of the level of the environmental condition (e.g., a little change corresponds to a little moisture; a large change corresponds to a large amount of moisture). The processing module 84 generates a coded value to represent the amount of adjustment and conveys the coded value to the sensor computing device 12 via the transmitter section 94 and the antenna 80 using back-scattering.

In addition to processing the sensed environmental condition, the processing module 84 processes a power level adjustment. For example, the power detection circuit 86 detects a power level of the received RF signal. In one embodiment, the processing module interprets the power level and communicates with the sensor computing device 12 to adjust the power level of the RF signal transmitted by the computing device 12 to a desired level (e.g., optimal for accuracy in detecting the environmental condition). In another embodiment, the processing module 84 includes the received power level data with the environmental sensed data it sends to the sensor computing device 12 so that the computing device can factor the power level into the determination of the environmental condition. One or more of these concepts will be described in greater detail with reference to one or more of FIGS. 4-12.

Figure 4:
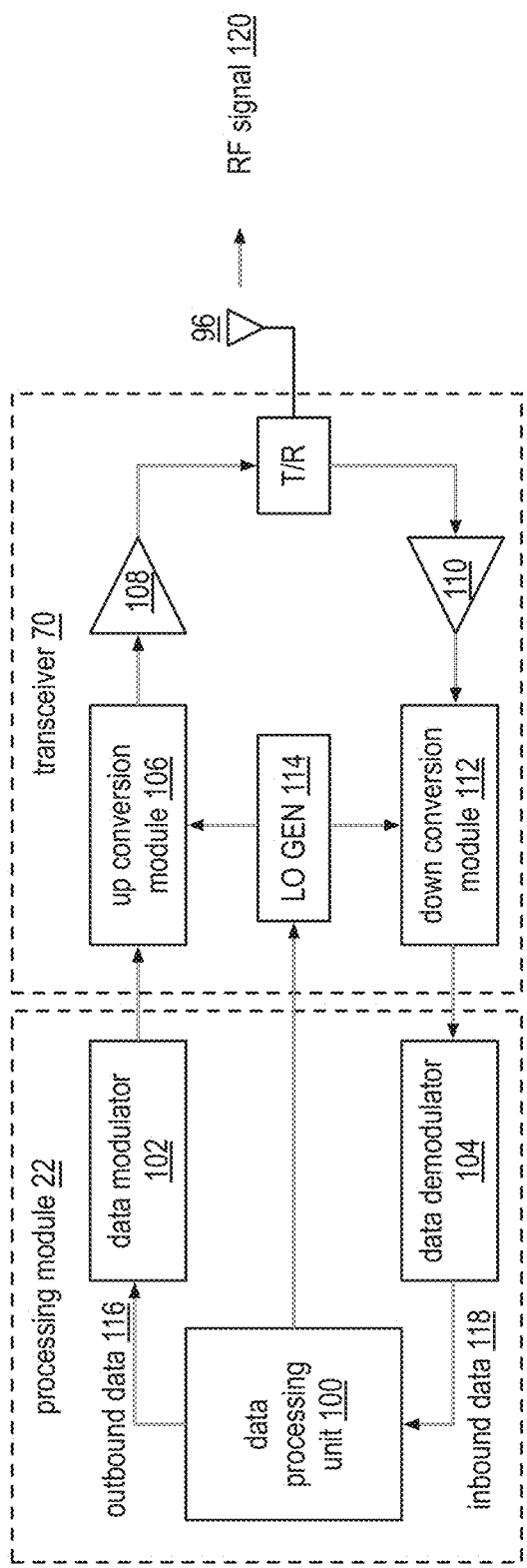
FIG. 4 is a schematic block diagram of an embodiment of a portion of a sensor computing device in accordance with the present invention.

FIG. 4 is a schematic block diagram of an embodiment of a portion of a sensor computing device 12 that includes the processing module 22 and the transceiver 70. The processing module 22 includes a data processing unit 100, a data modulator 102, and a data demodulator 104. The transceiver 70 includes an up conversion module 106, a transmit amplifier 108 (e.g., a power amplifier), a transmit/receive unit (T/R), a receiver amplifier 110 (e.g., a low noise amplifier), a down conversion module 112, and a local oscillation generator (LO GEN) 114.

Figure 5:
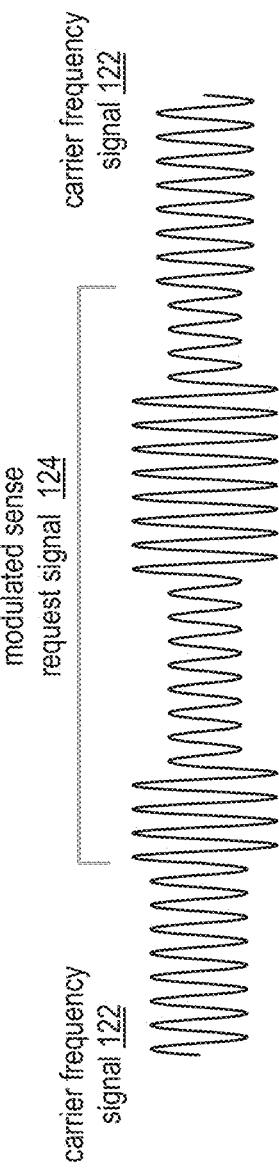
FIG. 5 is a diagram of an example of an RF signal in accordance with the present invention.

In an example of operation, the local oscillation generator (LOGEN) 114 generates, based on an input from the data processing module 22 (e.g., from the data processing unit) to generate a continuous wave signal at a particular carrier frequency (e.g., in the range of 902-928 MHz). To establish communication with the passive wireless sensor 16, the transceiver 70 first transmits, as an RF signal 120 the continuous wave signal at the particular carrier frequency 122 as shown in FIG. 5. During the startup, or power up, phase, the processing module 22 is not generating outbound data 116.

With reference to both FIGS. 4 and 5, when the passive wireless sensor 16 is powered up (as will be described below with reference to one or more of FIGS. 6-12), the data processing unit 100 generates outbound data 116 (e.g., a digital representation of a sense command). The data modulator 102 converts the outbound data 116 into modulated data and provides the modulated data to the up conversion module 106.

The up conversion module 106 mixes the continuous wave signal at a particular carrier frequency with the modulation data to produce the modulated sense request signal 124 of the RF signal 120. For example, the computing device 12 uses amplitude shifting keying (ASK) to generate the modulated sense request signal 124. As such, the modulated data produced by the data modulator 102 adjusts the amplitude of the continuous wave signal. In particular, for a digital value of 1, the modulated data is a first amplitude gain to change the amplitude of the continuous wave signal to a first level or a first pattern (e.g., per RFID standard ISO/IEC 18000-6) and, for a digital value of 0, the modulated data is a second amplitude gain to change the amplitude of the continuous wave signal to a second level or to a second a pattern (e.g., per the RFID standard). After transmitting the modulated sense request signal 124, the transmitter resumes sending the continuous wave (i.e., carrier frequency) signal 122.

The passive wireless sensor 16 receives the RF signal 120, down converts and demodulates it to recover the sense request signal (i.e., the outbound data 116). In response to the request or automatically, the passive wireless sensor 16 senses an environmental condition as discussed with reference to FIG. 3. The passive wireless sensor 16 generates a coded value representing a change in an operating parameter of its front end. Utilizing backscattering, the passive wireless sensor modulates the continuous wave signal with the coded value to produce an RF response signal.

The computing device receives the RF response signal via the antenna 96 and down converts it via the down conversion module 112. The data demodulator 104 demodulates the down converted signal to recapture the coded value as inbound data 118. As an example, the down conversion module 112 mixes the continuous wave signal produced by the LOGEN 114 with the RF response signal to produce a baseband, or near baseband, inbound signal. The data demodulator 104 demodulates the baseband, or near baseband, inbound signal to produce the inbound data 118. As a specific example of ASK demodulation, the down conversion module and the data demodulator perform inverse ASK functions of the data modulator 102 and the up conversion module 106.

Figure 6:
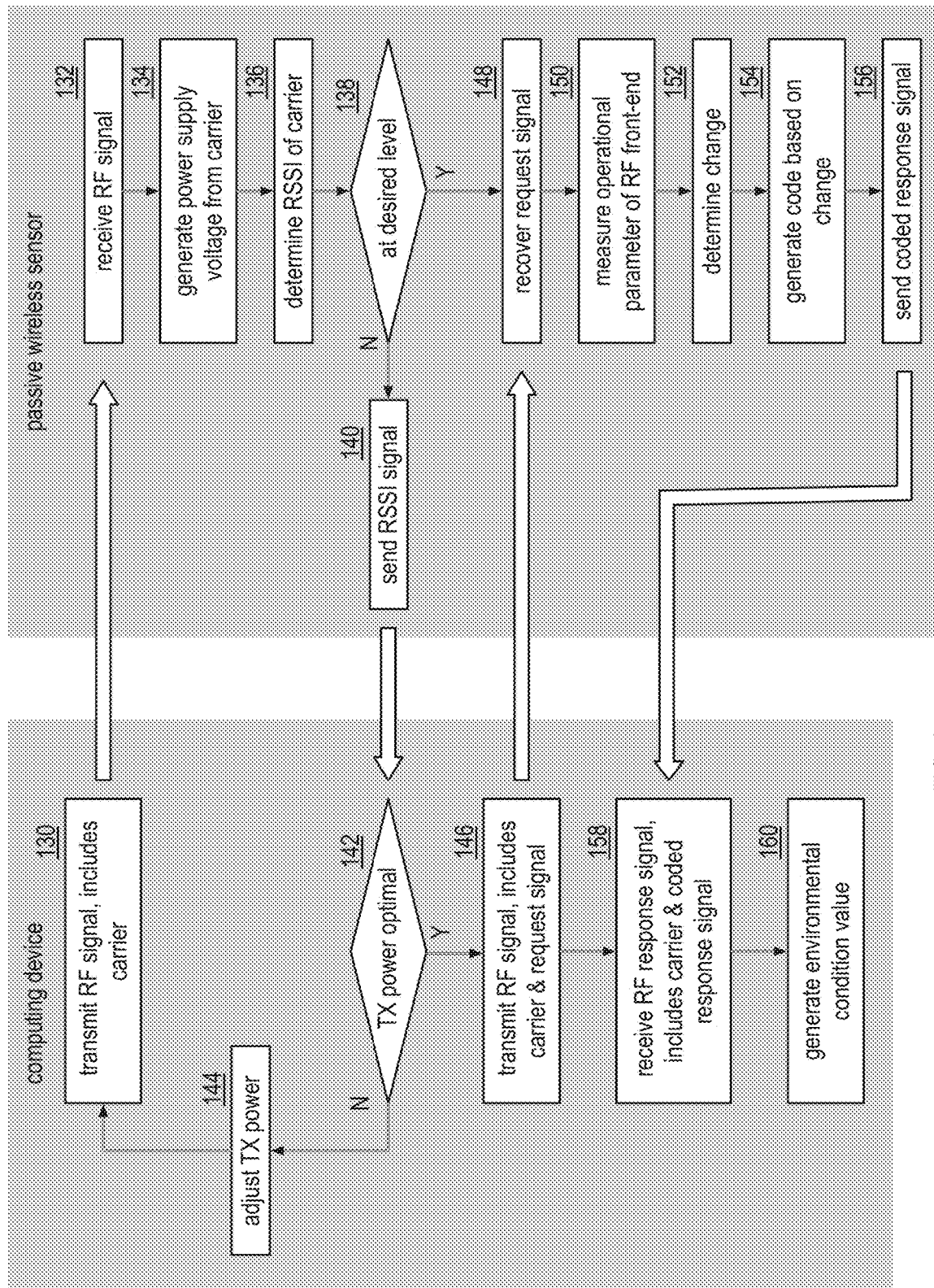
FIG. 6 is a logic diagram of an example of a sensor computing device communicating with a passive wireless sensor in accordance with the present invention.

FIG. 6 is a logic diagram of an example of a sensor computing device communicating with a passive wireless sensor. The method begins at step 130 where the sensor computing device transmits a radio frequency (RF) signal to a passive wireless sensor. The RF signal includes a carrier frequency signal and a modulated sense request signal. An example of the RF signal was discussed with reference to FIG. 5.

The method continues at step 132 where the passive wireless sensor receives the RF signal. The method continues at step 134 where the passive wireless sensor generates a power supply voltage from the carrier frequency signal. The method continues at step 136 where the passive wireless sensor determines received signal strength (RSSI) of the RF signal. Examples of creating power and measuring RSSI were discussed with reference to FIG. 3.

The method continues at step 138 where the passive wireless sensor determines whether the received signal strength of the RF signal is at a desired level. For example, to measure one or more environmental conditions, the passive wireless sensor includes a sensing element that, when exposed to the environmental condition (e.g., moisture), causes a change to an operational parameter (e.g., impedance) of the front-end of the passive wireless sensor (e.g., the sensing element, the antenna, the tuning circuit, the transmitter section, and/or the receiver section). The supply voltage and corresponding current are variables that can also affect the operation parameter. Thus, to remove the supply voltage and current as variables, they are set to particular levels, which corresponds to a particular level (i.e., the desired level) of the RSSI of the RF signal. If not, the method continues at step 140 where the passive wireless sensor sends an RSSI signal to the computing device 12. As an alternative to the passive wireless sensor determining whether the RSSI is at the desired level, it skips step 138 and sends the RSSI signal to the computing device, which determines whether the RSSI is at the desired level.

The method continues at step 142 where the sensor computing device determines whether the transmit power needs to be adjusted based on the RSSI. If yes, the method continues at step 144 where the sensor computing device adjusts the transmit power and retransmits the RF signal at the adjusted power level. This may be an iterative process or a single calculated process to adjust the transmit power.

Once the RSSI is at the desired level, the method continues at step 146 where the sensor computing device transmits the RF signal that includes the modulated sense request signal. The method continues at step 148 where the passive wireless sensor down converts and/or demodulates the RF signal to recover the sense request signal. In response the sense request signal, the method continues at step 150 where the passive wireless sensor measures, or retrieves a stored measurement, an operational parameter of a front-end of the passive wireless sensor. The method continues at step 152 where the passive wireless sensor determines a change to the operational parameter as result of the sensing (e.g., senses an impedance change by adjusting the tuning circuit to achieve resonance of the front-end with the carrier frequency and determine the amount of adjusting to be representative of the impedance change.)

The method continues at step 154 where the passive wireless sensor generates a coded value to represent the change. For example, a five-bit digital is used to represent the change, where a mid-range value represents little to no change in impedance, a low value represents a notable decrease in impedance, and a high value represent a notable increase in impedance. Note that dithering may be used to increase the resolution of the coded value (e.g., to eight bits). The passive wireless sensor modulates and up converts (e.g., back-scattering) the coded value to produce a coded sense response signal, which is transmitted to the sensor computing device in step 156.

The method continues at step 158 where the sensor computing device receives the response RF signal that includes the carrier frequency signal and the coded sense response signal. The method continues at step 160 where the sensor computing device generates an environmental condition value based on the coded sense response signal and an environmental conversion information. For example, the environmental condition value is a measure of moisture level as sensed by the passive wireless sensor.

Figure 7:
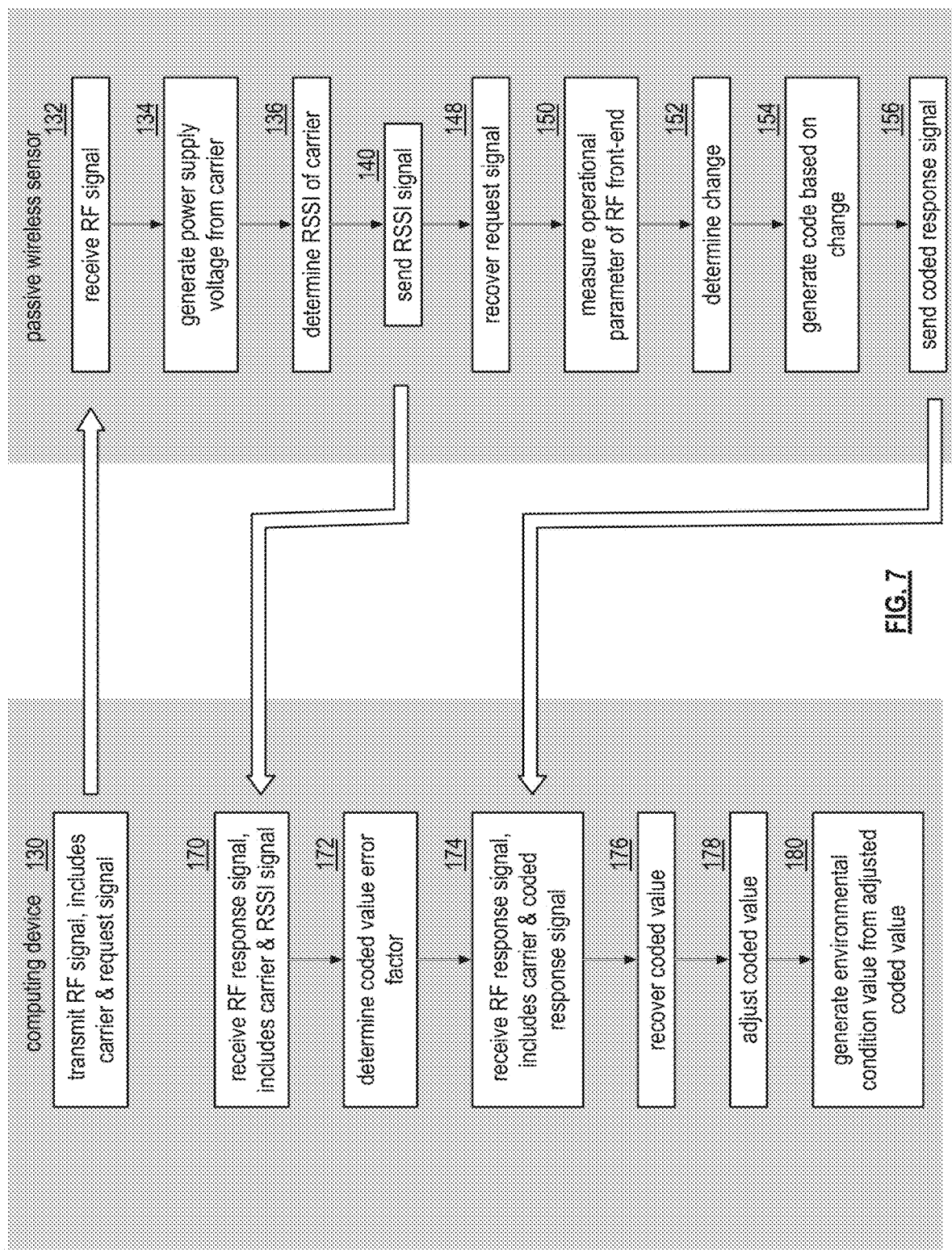
FIG. 7 is a logic diagram of another example of a sensor computing device communicating with a passive wireless sensor in accordance with the present invention.

FIG. 7 is a logic diagram of another example of a sensor computing device communicating with a passive wireless sensor, which has similar steps to the method of FIG. 6 (i.e., steps 130-136, 140, and 148-156). The method begins with steps 130-136 and 140, where the passive wireless sensor sends a RSSI signal to the sensor computing device. The method continues at step 170 where sensor computing device receives an RF response signal that includes the RSSI signal. The method continues at step 172 where the sensor computing device determines a coded value error factor based on the received signal strength of the RF signal and a desired received signal strength. As mentioned, the supply voltage and corresponding current are variables that can also affect the operational parameter. Thus, to remove the supply voltage and corresponding current as variables, the computing device determines how different the actual power level is from the desired power level. Based on this difference, the computing device determines the effect on the operating parameter (e.g., raise it or lower it). The amount of the effect is recorded as the coded value error factor.

The method continues at step 174 where the computing device receives the RF response signal that includes the carrier frequency and the coded response signal. The computing device down converts and/or demodulates the RF response signal to recover the coded value of the operational parameter change at step 176.

The method continues at step 178 where the computing device adjusts the coded value based on the coded value error factor to produce an adjusted coded value. The method continues at step 180 where the computing device generates the environmental condition value based on the adjusted coded value and the environmental conversion information.

FIG. 8 is a logic diagram of an example of generating an environmental condition value based on the environmental conversion information. The method begins at step 190 where the computing device determines the type of environmental condition being sensed by the passive wireless sensor. For example, the passive wireless sensor senses one or more of temperature, moisture (e.g., absence, presence, amount), pressure, weight, humidity, gas percentages, location proximity, light, and liquid properties.

The method continues at step 192 where the computing device selects, as the environmental conversion information, one of a plurality of environmental conversion databases based on the type of environmental condition. For instance, each type of sensing will have unique environmental condition information for converted the coded value into the environmental condition value. As a specific example, a five-bit coded value of moisture will have environmental condition information to convert the five-bit coded value into a specific measure of moisture (e.g., dry, 10% saturated, 50% saturated, 100% saturated).

In an embodiment, each environmental condition information is a database, where the coded value is an index to the database for determining (e.g., looking up) the actual environmental condition value. In another embodiment, the environmental condition information is one or more equations for converting the coded value into the actual environmental condition value. The environmental condition information includes empirical data and/or theoretic data.

The method continues at step 194 where the computing device recovers a coded value from the coded sense response signal. The method continues at step 196 where the computing device utilizing the coded value as an operand to the selected environmental conversion database to generate the environmental condition value. For example, the coded value is an index operand for looking up a specific value in the selected database. In another example, the coded value is a mathematical operand to one or more equations of the selected database.

FIG. 9 is a logic diagram of an example of calibrating communication between a sensor computing device communicating and a passive wireless sensor. The method begins at step 200 where the sensor computing device initiates a calibration process with the passive wireless sensor. During calibration, the passive wireless sensor is subjected to a known environmental condition (e.g., known moisture level, known temperature, known pressure, etc.). For example, the computing devices sends an RF signal 120 as shown in FIG. 5.

The method continues at step 202 where the sensor computing device receives a response calibration RF signal from the passive wireless sensor. The sensor computing device down converts and/or demodulates the RF signal, which includes the carrier frequency signal and a coded calibration signal, to produce coded value. The method continues at step 204 where the computing device generates a calibration reference environmental condition value based on the coded value and the environmental conversion information.

The method continues at step 206 where the computing device compares the calibration reference environmental condition value with the known environmental condition. If the comparison is favorable (e.g., the calibrated reference environment condition value indicates a 0% saturation level and the known environmental condition is dry, or 0% saturation), the method continues at step 210 where the computing device deems the passive wireless sensor to be calibrated.

If, however, the comparison is not favorable (e.g., the calibrated reference environment condition value indicates a 10% saturation level and the known environmental condition is dry, or 0% saturation), the method continues at step 212 or at step 214. At step 212, the computing device determines a calibration offset value (e.g., a value added to the coded value such that resulting saturation level is 0% for the calibration test) and sends it to the passive wireless device for storage and subsequent use.

At step 214 the computing device adjusts the environmental conversion information based on a difference between the calibration reference environmental condition value and the known environmental condition such that the resulting calibration environmental condition value substantially matches the known environmental condition. Note that the measured environmental condition is affected by the surrounding conditions of the passive wireless sensor. For example, if the passive wireless sensor is mounted on or near a metal surface, the metal surface will affect the operational parameter of the passive wireless sensor's front end. As another example, if the passive wireless sensor is in a noisy area (e.g., one or more interfering signals), the interfering signals will affect the operation parameter.

In an alternative method, the computing device initiates a calibration process with the passive wireless sensor that is subjected to a first known environmental condition (e.g., dry for a moisture test) and to a second known condition (e.g., 100% saturated for a moisture test. For the first known environmental condition, the passive wireless sensor generates a first coded value to represent a change in the operational parameter of its front end as a result of exposure to the first known environmental condition. The passive wireless sensor sends a first response calibration RF signal that includes the carrier frequency signal and a first coded calibration signal (i.e., the first coded value) to the computing device. The computing device stores the first coded value as a first calibrated coded value for the first known condition.

For the second known environmental condition, the passive wireless sensor generates a second coded value to represent a change in the operational parameter of its front end as a result of exposure to the second known environmental condition. The passive wireless sensor sends a second response calibration RF signal that includes the carrier frequency signal and a second coded calibration signal (i.e., the second coded value) to the computing device. The computing device stores the second coded value as a second calibrated coded value for the second known condition.

Figure 10:
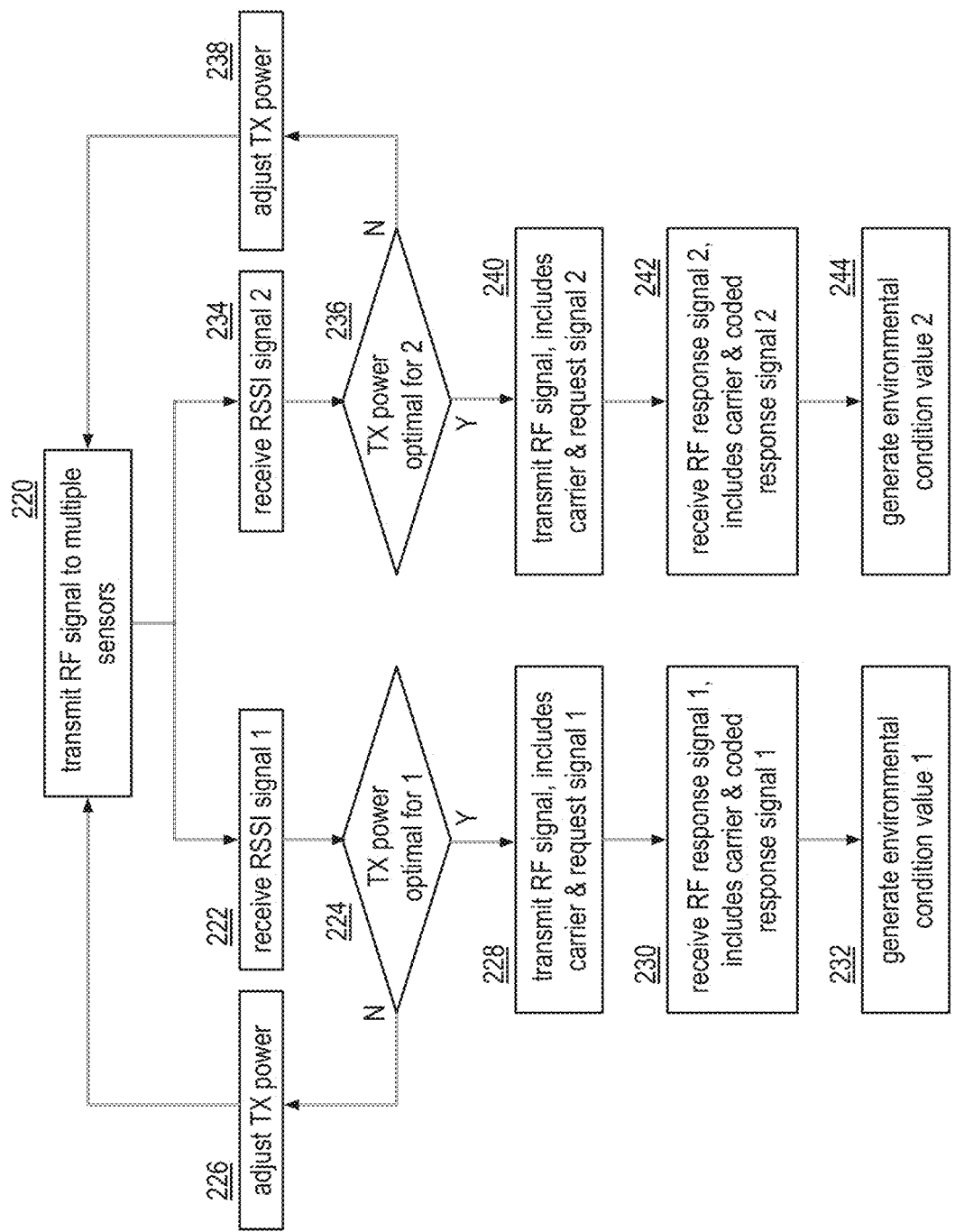
FIG. 10 is a logic diagram of an example of a sensor computing device communicating with multiple passive wireless sensors in accordance with the present invention.

FIG. 10 is a logic diagram of an example of a sensor computing device communicating with multiple passive wireless sensors. The method begins at step 220 where the sensor computing device is transmitting to multiple passive wireless sensors (e.g., a first and second sensor). The computing device may utilize time domain multiple access (FDMA), frequency domain multiple access (FDMA), a combination thereof to communication with multiple passive wireless sensors, and/or as described in the RFID standard.

To communicate with a first passive wireless sensor, the computing device executes steps 222 through 232 and, to communicate with a second passive wireless sensor, the computing device executes steps 234-244. Steps 222-232 are similar to steps 234-244. For instance, at steps 222 and 234, the computing device receives RSSI signals from the respective passive wireless sensors. The method continues to steps 224 and 236 where the computing device determines whether the respective RSSI signals are at the optimal, or desired, level. If not, the method continues at step 226 and/or step 238 where the computing device adjusts the transmit power and retransmits the RF signal(s).

When the transmit power levels are at the optimum levels, the method continues at steps 228 and 240 where the computing device transits an RF signal to the respective passive wireless sensor. The RF signal includes a carrier frequency signal (e.g., the same or different for each sensor) and a respective modulated sense request signal. The method continues at steps 230 and 242 where the computing device receives respective response RF signal(s) form the sensors. The method continues at steps 232 and 244 where the computing device generates respective environmental condition values based on the respective coded sense response signal and the respective environmental conversion information.

FIG. 11 is a diagram of an example of frequency hopping 254 among channels 252 within a frequency band 250. For example, the frequency band 250 includes frequencies in the range of 902 MHz to 928 MHz and includes 50 channels (e.g., 50 different carrier frequencies). The frequency hopping 254 among the channels 252 may be in accordance with a standard (e.g., RFID standard), in accordance with a predetermined pattern, or in accordance with a random pattern. The time between each frequency hop may be standardized, predetermined, or random.

FIG. 12 is a logic diagram of an example of frequency hopping communication between a sensor computing device and a passive wireless sensor. The method begins at step 260 where the computing device transmits, for a first hop of a frequency hopping frequency, the RF signal to the passive wireless sensor. For the first hop, the RF signal includes a first carrier frequency signal (e.g., a first channel) and a first modulated sense request signal. The method continues at step 262 where, in response to the first modulated sense request signal, the computing device receives a first response RF signal that includes the first carrier frequency signal and a first coded sense response signal.

The method continues at step 264 where the computing device recovers a first coded value from the first coded sense response signal (e.g., a first representative of the sensed environmental condition by the passive wireless sensor). The method continues, for a second frequency hop (e.g., a second carrier frequency or channel), at steps 266-270, where the computing devices recovers a second coded value. The method continues through "n" frequency hops where, at steps 272-276, the computing device recovers an "nth" coded value. Note that variances in the carrier frequency (e.g., using different channels) cause variances in the operational condition of the passive wireless sensor's front end. Further note that to execute the frequency hopping, the transceiver 70 includes a software defined radio that the computing device configures to accommodate the desired commutation with the passive wireless sensor.

The method continues at step 278 where the computing device generates the environmental condition value based on the "n" coded sense response signals (or a subset thereof), the environmental conversion information, and the carrier frequency signals. For example, the computing device averages the coded values to produce the final environmental condition value.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A communication system comprises:
a passive wireless sensor operable to:
receive a radio frequency (RF) signal, wherein the RF signal includes a carrier frequency signal and a modulated sense request signal;
generate a power supply voltage from the carrier frequency signal;
determine received signal strength (RSSI) of the RF signal based on the power supply voltage;
determine whether the RSSI is at a desired level; and
when the RSSI is at the desired level:
generate a response RF signal, wherein the response RF signal includes the carrier frequency and a coded sense response signal, wherein the coded sense response signal is representative of a sensed environmental condition, wherein the sensed environmental condition affects impedance of a front-end of the passive wireless sensor to produce an affected impedance, and wherein the passive wireless sensor generates the coded sense response signal based on tuning the affected impedance to resonate with the carrier frequency signal; and
a sensor computing device including a transceiver, memory, and a processing module operably coupled to the transceiver and the memory, wherein the processing module is operable to:
transmit the RF signal;
receive the response RF signal; and
generate an environmental condition value based on the coded sense response signal and environmental conversion information.

2. The communication system of claim 1 further comprises:
when the RSSI is not at the desired level, the passive wireless sensor is operable to:
send a RSSI signal to the sensor computing device; and
wherein the sensor computing device is operable to:
determine whether to adjust transmit power of the RF signal based on the RSSI signal; and
when the processing module of the sensor computing device determines to adjust transmit power of the RF signal:

the sensor computing device is operable to:
adjust the transmit power to produce an adjusted transmit power; and
resend the RF signal at the adjusted transmit power.

3. The communication system of claim 1 further comprises:
the passive wireless sensor is further operable to:
prior to determining whether the RSSI is at the desired level, send a RSSI signal to the sensor computing device; and
the processing module of the sensor computing device is further operable to:
determine whether to adjust transmit power of the RF signal based on the RSSI signal; and
when processing module of the sensor computing device determines to adjust transmit power of the RF signal:
adjust the transmit power to produce an adjusted transmit power; and
resend the RF signal at the adjusted transmit power.

4. The communication system of claim 1 further comprises:
the processing module of the sensor computing device is further operable to:
receive another response RF signal that includes the carrier frequency and an RSSI signal;
determine a coded value error factor based on the RSSI signal and the desired level;
adjust a coded value of the coded sensed response signal based on the coded value error factor to produce an adjusted coded value; and
generate the environmental condition value based on the adjusted coded value and the environmental conversion information.

5. The communication system of claim 1 further comprises:
the passive wireless sensor is further operable to:
down convert the RF signal to recover the sense request signal;
tune the impedance of the front-end of the passive wireless sensor to resonate with the carrier frequency, wherein the front-end includes a sensing element for sensing an environmental condition and wherein the sensing of the environmental condition by the sensing element alters the impedance of the front-end; and
generate the coded sense response signal as a representation of the tuning of the impedance of the front-end.

6. The communication system of claim 5, wherein the passive wireless sensor is further operable to generate the environmental condition value by:
determining a type of environmental condition being sensed by the passive wireless sensor;
selecting, as the environmental conversion information, one of a plurality of environmental conversion databases based on the type of environmental condition;
recovering a coded value from the coded sense response signal; and
utilizing the coded value as an operand to the one of the plurality of environmental conversion databases to generate the environmental condition value.

7. The communication system of claim 1, wherein the transceiver is a software defined transceiver for communicating with the passive wireless sensor.

8. The communication system of claim 1 further comprises:
the processing module of the sensor computing device is further operable to:
initiate a calibration process with the passive wireless sensor, wherein the passive wireless sensor is subjected to a known environmental condition;
receive a response calibration RF signal that includes the carrier frequency signal and a coded calibration signal from the passive wireless sensor, wherein the coded calibration signal is representative of the known environmental condition by the passive wireless sensor;
generate a calibration reference environmental condition value based on the coded calibration signal and the environmental conversion information;
compare the calibration reference environmental condition value with the known environmental condition;
when the calibration reference environmental condition value compares unfavorably with the known environmental condition:
adjust the environmental conversion information based on a difference between the calibration reference environmental condition value and the known environmental condition; or
send a calibration offset to the passive wireless sensor, wherein the passive wireless sensor utilizes the calibration offset when generating the coded sense response signal such that the coded sense response signal is a more accurate representation of the sensed environmental condition.

9. The communication system of claim 1 further comprises:
the processing module of the sensor computing device is further operable to:
transmit the RF signal to the passive wireless sensor using a frequency hopping scheme, wherein the RF signal includes, for a first hop of the frequency hopping scheme, a first carrier frequency signal of a plurality of carrier frequency signals and the modulated sense request signal and includes, for a second hop of the frequency hopping scheme, a second carrier frequency signal of the plurality of carrier frequency signals and the modulated sense request signal;
in response to the modulated sense request signal:
receive a first response RF signal that includes the first carrier frequency signal and a first coded sense response signal from the passive wireless sensor, wherein the first coded sense response signal is a first representative of the sensed environmental condition by the passive wireless sensor;
receive a second response RF signal that includes the second carrier frequency signal and a second coded sense response signal from the passive wireless sensor, wherein the second coded sense response signal is a second representative of the sensed environmental condition by the passive wireless sensor; and
generate the environmental condition value based on the first and second coded sense response signal, the environmental conversion information, the first carrier frequency signal, and the second carrier frequency signal.

10. The communication system of claim 1, wherein the environmental condition value is a measure of one of:
  temperature;
  moisture;
  pressure;
  weight;
  humidity;
  gas percentages;
  location proximity;
  light; and
  liquid properties.

11. The communication system of claim 1 further comprises:
  the processing module of the sensor computing device is further operable to:
    initiate a calibration process with the passive wireless sensor, wherein the passive wireless sensor is subjected to a first known environmental condition and to a second known condition;
    receive a first response calibration RF signal that includes the carrier frequency signal and a first coded calibration signal from the passive wireless sensor, wherein the first coded calibration signal includes a first coded value corresponding to a measurement of the first known environmental condition by the passive wireless sensor;
    receive a second response calibration RF signal that includes the carrier frequency signal and a second coded calibration signal from the passive wireless sensor, wherein the second coded calibration signal includes a second coded value corresponding to a measurement of the second known environmental condition by the passive wireless sensor;
    store the first coded value as a first calibrated coded value for the first known condition; and
    store the second coded value as a second calibrated coded value for the second known condition.

12. The method of claim 1 further comprises:
  prior to determining whether the RSSI is at the desired level, sending, by the passive wireless sensor, a RSSI signal to the sensor computing device;
  determining, by the processing module of the sensor computing device, whether to adjust transmit power of the RF signal based on the RSSI signal; and
  when the processing module of the sensor computing device determines to adjust transmit power of the RF signal:
    adjusting, by the processing module of the sensor computing device, the transmit power to produce an adjusted transmit power; and
    resending, by the transceiver of the sensor computing device, the RF signal at the adjusted transmit power.

13. The method of claim 1, wherein the transceiver of the sensor computing device is a software defined transceiver for communicating with the passive wireless sensor.

14. The method of claim 1 further comprises:
  initiating, by the processing module of the sensor computing device, a calibration process with the passive wireless sensor, wherein the passive wireless sensor is subjected to a known environmental condition;
  receiving, by the transceiver of the sensor computing device, a response calibration RF signal that includes the carrier frequency signal and a coded calibration signal from the passive wireless sensor, wherein the coded calibration signal is representative of the known environmental condition by the passive wireless sensor;
  generating, by the processing module of the sensor computing device, a calibration reference environmental condition value based on the coded calibration signal and the environmental conversion information;
  comparing, by the processing module of the sensor computing device, the calibration reference environmental condition value with the known environmental condition; and
  when the calibration reference environmental condition value compares unfavorably with the known environmental condition:
    adjusting, by the processing module of the sensor computing device, the environmental conversion information based on a difference between the calibration reference environmental condition value and the known environmental condition; or
    sending, by the transceiver of the sensor computing device, a calibration offset to the passive wireless sensor, wherein the passive wireless sensor utilizes the calibration offset when generating the coded sense response signal such that the coded sense response signal is a more accurate representation of the sensed environmental condition.

15. A method for execution by a communication system, the method comprises:
  transmitting, by a transceiver of a sensor computing device of the communication system, a radio frequency (RF) signal, wherein the RF signal includes a carrier frequency signal and a modulated sense request signal to a passive wireless sensor of the communication system;
  generating, by the passive wireless sensor, a power supply voltage from the carrier frequency signal;
  determining, by the passive wireless sensor, received signal strength (RSSI) of the RF signal based on the power supply voltage;
  determining, by the passive wireless sensor, whether the RSSI is at a desired level; and
  when the RSSI is at the desired level:
    generating, by the passive wireless sensor, a response RF signal, wherein the response RF signal includes the carrier frequency and a coded sense response signal, wherein the coded sense response signal is representative of a sensed environmental condition, wherein the sensed environmental condition affects impedance of a front-end of the passive wireless sensor to produce an affected impedance, and wherein the passive wireless sensor generates the coded sense response signal based on tuning the affected impedance to resonate with the carrier frequency signal; and
  receiving, by the transceiver of the sensor computing device, the response RF signal; and
  generating, by a processing module of the sensor computing device, an environmental condition value based on the coded sense response signal and environmental conversion information.

16. The method of claim 15 further comprises:
  when the RSSI is not at the desired level:
    sending, by the passive wireless sensor, a RSSI signal to the sensor computing device;
    receiving, by the transceiver of the sensor computing device, the RSSI signal; and
    determining, by the processing module of the sensor computing device, whether to adjust transmit power of the RF signal based on the RSSI signal; and when processing module of the sensor computing device determines to adjust transmit power of the RF signal:
adjusting, by the processing module of the sensor computing device, the transmit power to produce an adjusted transmit power; and
resending, by the transceiver of the sensor computing device, the RF signal at the adjusted transmit power.

17. The method of claim 15 further comprises:
receiving, by the transceiver of the sensor computing device, another response RF signal that includes the carrier frequency and an RSSI signal;
determining, by the processing module of the sensor computing device, a coded value error factor based on the RSSI signal and the desired level;
adjusting, by the processing module of the sensor computing device, a coded value of the coded sensed response signal based on the coded value error factor to produce an adjusted coded value; and
generating, by the processing module of the sensor computing device, the environmental condition value based on the adjusted coded value and the environmental conversion information.

18. The method of claim 15 further comprises:
down converting, by the passive wireless sensor, the RF signal to recover the sense request signal;
tuning, by the passive wireless sensor, the impedance of the front-end of the passive wireless sensor to resonate with the carrier frequency, wherein the front-end includes a sensing element for sensing an environmental condition and wherein the sensing of the environmental condition by the sensing element alters the impedance of the front-end; and
generating, by the passive wireless sensor, the coded sense response signal as a representation of the tuning of the impedance of the front-end.

19. The method claim 18, wherein the environmental condition value is generated by:
determining a type of environmental condition being sensed by the passive wireless sensor;
selecting, as the environmental conversion information, one of a plurality of environmental conversion databases based on the type of environmental condition;
recovering a coded value from the coded sense response signal; and
utilizing the coded value as an operand to the one of the plurality of environmental conversion databases to generate the environmental condition value.

20. The method of claim 15 further comprises:
transmitting, by the transceiver of the sensor computing device, the RF signal to the passive wireless sensor using a frequency hopping scheme, wherein the RF signal includes, for a first hop of the frequency hopping scheme, a first carrier frequency signal of a plurality of carrier frequency signals and the modulated sense request signal and includes, for a second hop of the frequency hopping scheme, a second carrier frequency signal of the plurality of carrier frequency signals and the modulated sense request signal;
in response to the modulated sense request signal:
receiving, by the transceiver of the sensor computing device, a first response RF signal that includes the first carrier frequency signal and a first coded sense response signal from the passive wireless sensor, wherein the first coded sense response signal is a first representative of the sensed environmental condition by the passive wireless sensor;
receiving, by the transceiver of the sensor computing device, a second response RF signal that includes the second carrier frequency signal and a second coded sense response signal from the passive wireless sensor, wherein the second coded sense response signal is a second representative of the sensed environmental condition by the passive wireless sensor; and
generating, by the processing module of the sensor computing device, the environmental condition value based on the first and second coded sense response signal, the environmental conversion information, the first carrier frequency signal, and the second carrier frequency signal.

21. The method of claim 15, wherein the environmental condition value is a measure of one of:
temperature;
moisture;
pressure;
weight;
humidity;
gas percentages;
location proximity;
light; and
liquid properties.

22. The method of claim 15 further comprises:
initiating, by the processing module of the sensor computing device, a calibration process with the passive wireless sensor, wherein the passive wireless sensor is subjected to a first known environmental condition and to a second known condition;
receiving, by the transceiver of the sensor computing device, a first response calibration RF signal that includes the carrier frequency signal and a first coded calibration signal from the passive wireless sensor, wherein the first coded calibration signal includes a first coded value corresponding to a measurement of the first known environmental condition by the passive wireless sensor;
receiving, by the transceiver of the sensor computing device, a second response calibration RF signal that includes the carrier frequency signal and a second coded calibration signal from the passive wireless sensor, wherein the second coded calibration signal includes a second coded value corresponding to a measurement of the second known environmental condition by the passive wireless sensor;
storing, by the memory of the sensor computing device, the first coded value as a first calibrated coded value for the first known condition; and
storing, by the memory of the sensor computing device, the second coded value as a second calibrated coded value for the second known condition.

* * * * *